United States Patent [19]

Tsaur et al.

[11] 4,372,031
[45] Feb. 8, 1983

[54] METHOD OF MAKING HIGH DENSITY MEMORY CELLS WITH IMPROVED METAL-TO-SILICON CONTACTS

[75] Inventors: Shyh-Chang Tsaur, Stafford; Chang-Kiang Kuo, Austin, both of Tex.

[73] Assignee: Texas Instruments Incorporated, Dallas, Tex.

[21] Appl. No.: 133,375

[22] Filed: Mar. 21, 1980

[51] Int. Cl.³ .......................................... H01L 21/28
[52] U.S. Cl. ........................... 29/571; 29/577 C; 29/591
[58] Field of Search ............. 29/571, 577 C, 591; 357/23 VT

[56] References Cited

U.S. PATENT DOCUMENTS

| | | | |
|---|---|---|---|
| 3,541,543 | 11/1970 | Crawford et al. | 357/41 X |
| 3,914,855 | 10/1975 | Cheney et al. | 29/571 |
| 3,984,822 | 10/1976 | Simko et al. | 29/571 X |
| 4,055,444 | 10/1977 | Rao | 148/1.5 |
| 4,112,509 | 9/1978 | Wall | 357/51 X |
| 4,151,021 | 4/1979 | McElroy | 148/1.5 X |
| 4,230,504 | 10/1980 | Kuo | 148/1.5 |

Primary Examiner—G. Ozaki
Attorney, Agent, or Firm—John G. Graham

[57] ABSTRACT

Semiconductor read only memory (ROM) or electrically programmable memory (EPROM) devices are constructed using a metal-to-silicon contact arrangement which provides small cell size. An intervening polysilicon segment allows the silicon region underlying a metal contact area to be much smaller than in prior cells. The layout and cell structure provides a high density array. The use of the polysilicon segment also prevents the occurance of problems with spiking of metal through shallow implanted N+ regions.

10 Claims, 17 Drawing Figures

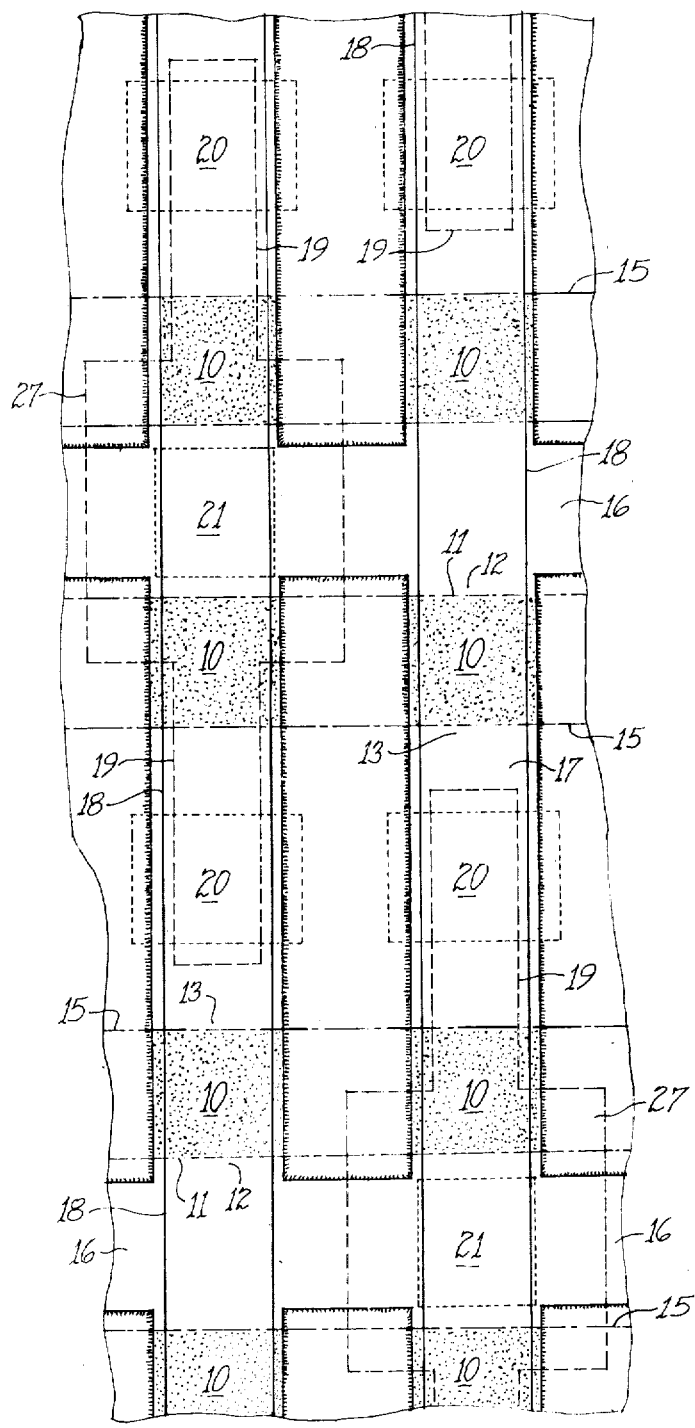
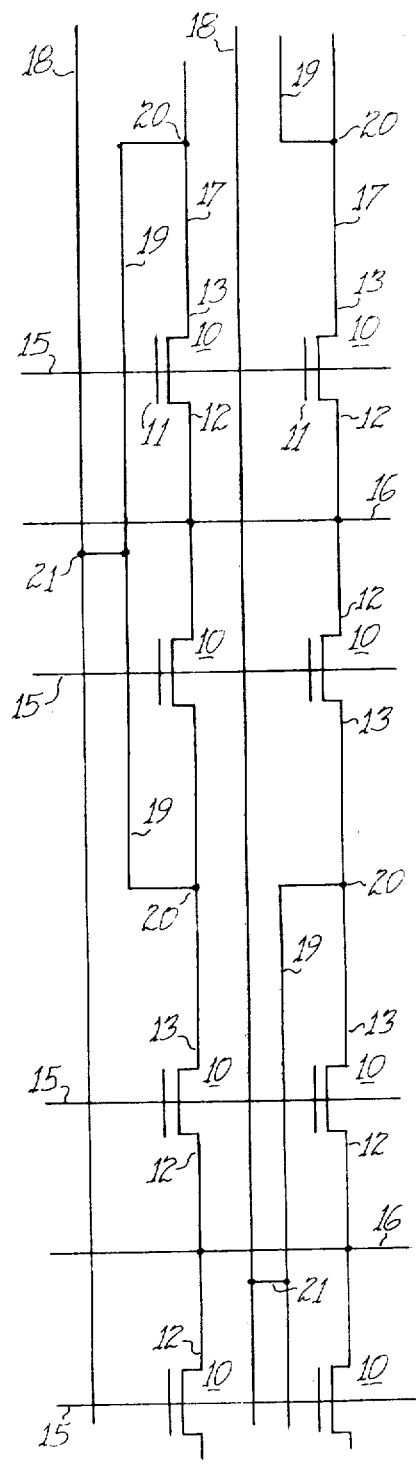
Fig. 1
Fig. 2

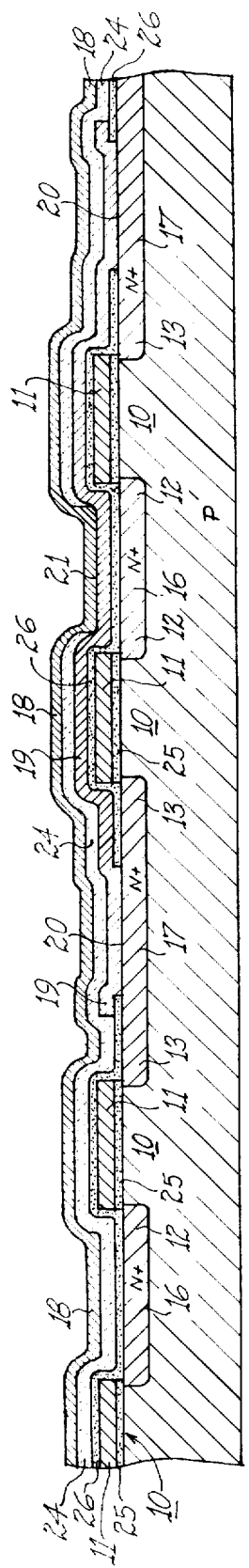
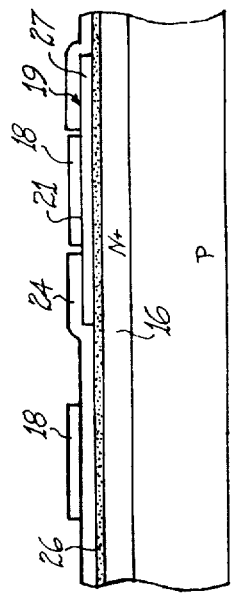
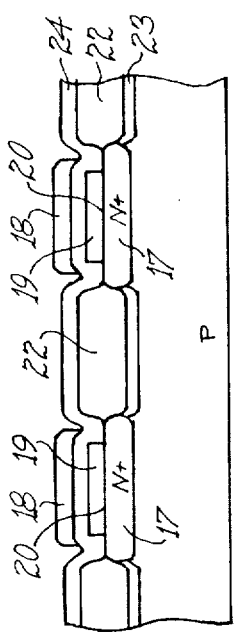
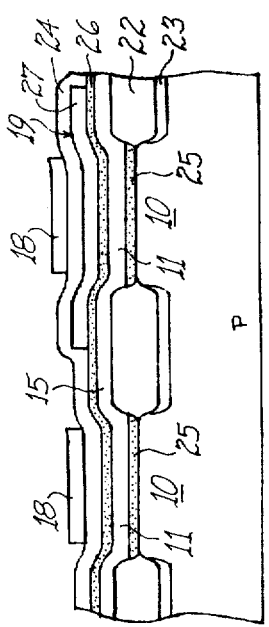
Fig. 3a
Fig. 3b
Fig. 3c
Fig. 3d

METHOD OF MAKING HIGH DENSITY MEMORY CELLS WITH IMPROVED METAL-TO-SILICON CONTACTS

RELATED CASES

This application is related to our U.S. application Ser. No. 133,376, filed herewith, assigned to Texas Instruments.

BACKGROUND OF THE INVENTION

This invention relates to semiconductor memory devices, and more particularly to an N-channel silicon gate MOS read only memory or electrically programmable memory and processes for manufacture.

ROM and EPROM devices are manufactured by the methods disclosed in the patents and applications set forth below. While these methods are quite well developed, there is a continuing trend for smaller cell sizes and more dense cell arrays. The economics of manufacture of these devices, and of mounting them on circuit boards in the system, are such that the number of memory bits per semiconductor chip is advantageously as high as possible. ROMs and EPROMs of up to 32K bits (32768) are available at present. Standard sizes will progress through 64K, 128K, 256K and 1 megabit, dictating that cell sizes for the storage cells be quite small. Metal gate P-channel ROMs of small size can be relatively easily fabricated in the manner set forth in U.S. Pat. No. 3,541,543, assigned to Texas Instruments, but most microprocessor and computer parts are now made by the N-channel silicon gate process because of the shorter access times provided. In the past, the N-channel process has not been favorable to layout of ROM cells of the smallest size. N-channel ROMs are in some methods programmed by the presence or absence of a contact to the drain region; this requires a contact to each cell, and further metal-to-silicon contacts use excess space on the chip. EPROMs are typically made by the processes of U.S. Pat. No. 4,112,509 or 3,984,822. Again, the metal-to-silicon contacts represent a large fraction of the cell areas.

It is the principal object of this invention to provide a semiconductor ROM or EPROM memory cell of small size which uses a minumum of space for metal-to-silicon contacts, yet still is made by methods compatable with the standard high volume N-channel process. Another object is to provide a small-area MOS ROM or EPROM cell or the like, which is made by the standard N-channel self-aligned silicon gate manufacturing processes and is of small cell size and of a layout which provides high density cell arrays.

SUMMARY OF THE INVENTION

In accordance with an embodiment of the invention, semiconductor read only memory (ROM) or electrically programmable memory (EPROM) devices are constructed using a metal-to-silicon contact arrangement which provides small cell size. An intervening polysilicon segment allows the silicon region underlying a metal contact area to be much smaller than in prior cells. The layout and cell structure provides a high density array.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is a greatly enlarged plan view of a small portion of a semiconductor chip showing the physical layout of a part of a ROM array made according to one embodiment of the invention;

FIG. 2 is an electrical schematic diagram of the ROM of FIG. 1;

FIGS. 3a-3d are elevation views in section of the cell of FIG. 1, taken along the lines a—a, b—b, c—c, and d—d, respectively;

DETAILED DESCRIPTION OF SPECIFIC EMBODIMENTS

Figure 4:
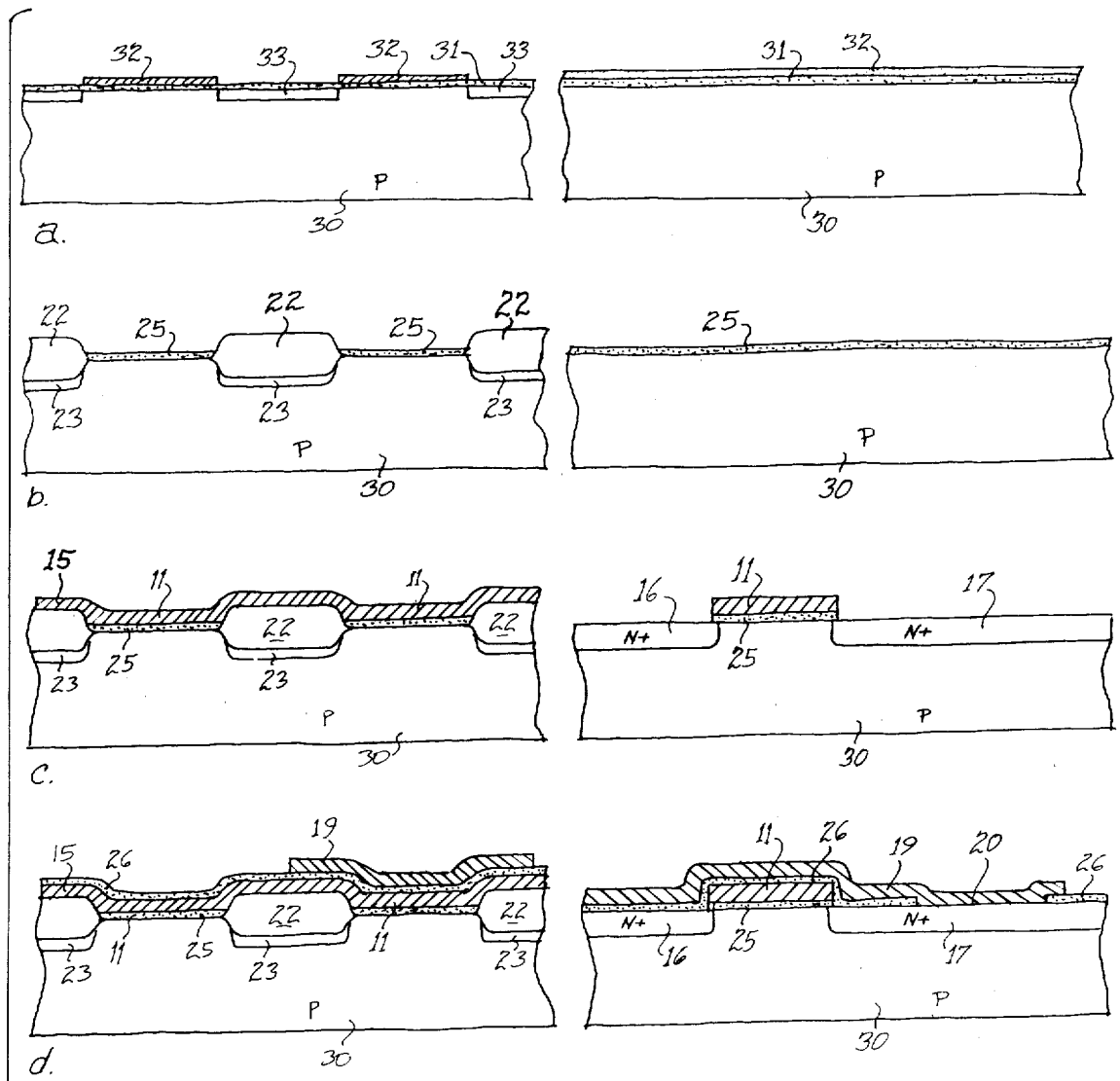
FIGS. 4a-4d are elevation views in section of the ROM array of FIGS. 1 and 3a-3d, at successive stages in the manufacturing process, taken generally along the line a—a in FIG. 1.

With reference to FIGS. 1, 2, and 3a-3d, a read only memory is illustrated which is constructed according to the invention. The array consists of a large number of cells 10, only eight of which are shown. Each cell is an MOS transistor having a gate 11, a source 12 and a drain 13. The gates 11 are parts of first level polysilicon strips 15 which are the X address lines for the array. The sources are part of N+ diffused regions 16 which are connected to ground or Vss, while the drains are part of N+ diffused regions 17 which are connected to metal Y or output lines 18 via second level polysilicon segments 19. These segments make connection to the silicon regions 17 at contact areas 20, and make connection to the metal strips 18 at contact areas 21.

The array would typically contain perhaps 32K, 64K, 128K or 256K cells formed on a silicon bar which is perhaps about 200 mils on a side or 40,000 sq. mil area, depending upon the bit density. The eight cells 10 shown would be on a minute part of the bar, perhaps one or two mils wide. A 64K ROM would require 256 of the X address lines 15 and 256 of the Y lines, providing 65,536 bits.

A thick field oxide coating 22 covers parts of the bar not occupied by the transistors or diffused regions and interconnects, and P+ channel stop regions 23 are formed underneath all the thick field oxide. An interlevel oxide coating 24 is provided to insulate the polysilicon strips 15 and segments 19 from the metal strips 18.

The gate insulator for the transistors 10 is formed by thin thermal oxide 25 beneath the gates 11. A thermal oxide coating 26 separates the first and second level polysilicon.

An important feature of the invention is that the metal lines 18 are spaced a short distance from one another. This is possible because the metal-to-poly contact areas 21 are staggered rather than being adjacent one another, and because each contact 21 makes connection to the drains 13 of four transistors 10. Each of the second level poly segments 19 has an enlarged central part 27 which allows space for a non-critical alignment of the mask which forms the hole for contact 21. The mask which forms the holes for contacts 20 also allows considerable misalignment. It is important that the metal lines 18 do not make direct connection to the N+ moat regions 16 because the moat in such case would have to be much wider to allow alignment tolerence; metal cannot be allowed to touch the juncture of moat and field oxide because of the excess leakage which usually results when this happens.

The ROM array of FIGS. 1, 2 and 3a-3d may be programmed in several different ways. As described below, ion implant programming is used. Alternatively, moat mask programming could be employed, in which case field oxide would exist below selected ones of the gate 11, instead of thin gate oxide 25.

Turning now to FIGS. 4a-4d, a process for making the ROM array according to the invention will be described. The right hand side of these FIGURES corresponds to the section view of FIG. 3a, while the left hand side shows the section view of FIG. 3c. The starting material is a slice of P-type monocrystalline silicon, typically 4 inches in diameter and twenty mils thick, cut on the <100> plane, of a resistivity of about 6 to 8 ohm-cm. In the FIGURES the portion shown of the silicon bar 30 represents only a very small undivided part of the slice, perhaps 1 or 2 mils wide, for each part. After appropriate cleaning, the slice is oxidized by exposing to oxygen in a furnace at an elevated temperature of perhaps 1100 degrees C. to produce an oxide layer 31 over the entire slice of a thickness of about 1000 Å. Next, a layer 32 of silicon nitride of about 1000 Å thickness is formed over the entire slice by exposing to an atmosphere of dichlorosilane and ammonia in a reactor. A coating of photoresist is applied to the entire top surface of the slice, then exposed to ultraviolet light through a mask which defines the desired pattern of the thick field oxide 22 and the P+ channel stop 23. The resist is developed, leaving areas where nitride is then etched away by a nitride etchant, removing the exposed part of the nitride layer 32 but leaving in place the oxide layer 31; the nitride etchant does not react with the photoresist.

Using photoresist and nitride as a mask, the slice is now subjected to an ion implant step to produce the channel stop regions 23 whereby boron atoms are introduced into unmasked regions 33 of silicon. This implant may be at a dosage of about $10^{13}$ per sq. cm at 150 KeV. The regions 33 do not exist in the same form in the finished device, because some of this part of the slice will be consumed in the field oxidation pocedure. Preferably the slice is subjected to a heat treatment after implant but prior to field oxide growth, as set forth in U.S. Pat. No. 4,055,444, assigned to Texas Instruments.

The next step in the process is formation of field oxide 22, which is done by subjecting the slices to steam or an oxidizing atmosphere at about 1000° C. for perhaps several hours. This causes a thick field oxide layer 22 to be grown as seen in FIG. 4b. This region extends into the silicon surface because silicon is consumed as it oxidizes. The remaining parts of the nitride layer 32 mask oxidation. The thickness of this layer 23 is about 10,000 Å, part of which is above the original surface and part below. The boron doped P+ regions 33 formed by implant will be partly consumed, but will also diffuse further into the silicon ahead of the oxidation front, producing P+ channel stop regions 23 much deeper than the original regions 33.

Next the remaining nitride layer 32 is removed by an etchant which attacks nitride but not silicon oxide, then the oxide 31 is removed by etching and the exposed silicon cleaned. The gate oxide 25 is grown by thermal oxidation to a thickness of about 500 Å. In areas of the slice where depletion load devices are required, although not pertinent to this invention, a masked ion implant step would be done at this point. Likewise, the threshold voltage of the enhancement mode transistors in the ROM array or periphery may be adjusted by ion implant. Also, windows for first level polysilicon to silicon contacts, if needed in the periphery, are patterned and etched at this point using photoresist; none are needed in the ROM array itself as shown.

As seen in FIG. 4c a first level of polycrystalline silicon is deposited over the entire slice in a reactor using standard techniques. Since the implant for programming penetrates this layer of polysilicon, the thickness is only about 5000 Å; it may be thicker in the usual silicon gate process. The first level polysilicon layer is patterned by applying a layer of photoresist, exposing to ultraviolet light through a mask prepared for this purpose, developing, so the remaining photoresist masks the gates 11 and the lines 15, as well as the gates of peripheral transistors and inter-connections in other parts of the circuit on the chip. The unmasked polycrystalline silicon is etched away, leaving the gates 11 in the ROM array, as well as the lines 15. The thin oxide 25 underneath the gates 11 is the gate oxide of the transistors. The slice is next subjected to a standard N+ arsenic implant or phosphorus diffusion whereby the N+ regions 16 and 17 are formed using the gates 11 and the field oxide 22 as a mask. If ion implant is used, the photoresist over the gates 11 used to define the gates is also an implant mask.

If implant programming is used, up to this point in the process all slices are exactly the same as no programming mask has been employed. The slices are processed routinely to this stage with no requirement for separate inventory controls and separate identification of each lot. An inventory of slices finished up through this stage may be maintained for quick response to custom orders for ROM codes.

It is at this point prior to deposition of multilevel oxide 24 that the implant programming is done. The ROM array is programmed by first depositing photoresist then exposing it using a unique mask which defines the ROM code. After developing, an aperture is defined over each cell 10 to be programmed as a "0", and each cell 10 to be a "1" is left covered. The slice is then subjected to a boron implant at about 180 KeV to a dosage of about $10^{13}$ per sq. cm. The energy level and dosage are dependent upon the thicknesses of the oxide layer 25 and the polysilicon gates 11, as well as the change in threshold desired. At this energy level, the ion implant penetrates the polycrystalline silicon gate 11 and gate oxide 25 to create an implanted region in the channel area. This implant raises the threshold voltage above about 5 V. Since the part operates on a supply voltage Vdd of 5 V., the full logic 1 level will not turn on the transistor. The transistors covered by the photoresist will not be implanted so will retain the usual threshold voltage of about 0.8 V. Mask alignment for creating the apertures for this programming mask is non-critical. The active channel area to be implanted has already been defined in previous processing steps. The implanted ions are activated by subsequent high temperature steps.

A method of making ROM devices with ion implant programming is disclosed in copending application Ser. No. 900,549, filed Apr. 27, 1978, by C-K Kuo, now U.S. Pat. No. 4,230,504, assigned to Texas Instruments.

The next step in the process is forming of the second level polysilicon segments. First, the slice is subjected to a thermal oxidation step to create the oxide coating 26 over the first level poly gates 11, as well as the surface of the regions 16 and 17 (if the oxide 25 has been stripped). Then, a photoresist mask and etch operation opens the holes in the oxide 26 for the contacts 20. The mask alignment for this operation is non-critical. Next, the second level of polycrystalline silicon is deposited as before, and doped N+. This layer can be thicker as an ion-implant need not penetrate. A photoresist operation is now used to define the segments 19 with enlarged areas 27. Alignment of the mask for this operation is also noncritical.

A thick layer 24 of silicon oxide is deposited by decomposition of silane at a low temperature, about 400° C. This layer insulates the metal level from the polycrystalline silicon and is referred to as multilevel oxide.

The multilevel oxide layer 24 is patterned by a photoresist operation, exposing contact areas for metal-to-second-level-poly-silicon contacts 21, as well as contact areas for metal contacts and interconnections used in the periphery of the chip in the input buffers, decoders, sense amplifiers, and the like. The metal contacts and interconnections are made in the usual manner by depositing a thin film of aluminum over the entire top surface of the slice then patterning it by a photoresist mask and etch sequence. This leaves metal strips which are the Y output lines as seen in FIGS. 1 and 3a–3d.

A thick protective oxide layer (not shown) covers the metallization, with aperatures etched in this layer above bonding pads. This layer is non-thermal oxide deposited at low temperature in accord with standard MOS manufacturing methods. Usually this oxide covers everything except the bonding pads on a bar.

In operation of the ROM array of FIGS. 1-3, the X address selects one of the lines 15, (i.e., one of the 256 such lines in a 64K ROM) and this selected line is held at logic 1 level or about +5 V. The remaining lines are held at Vss, logic 0. The Y address selects one of the 256 lines 19 and this line is connected via the Y decoder to the output. For dynamic ROMs, the Y lines would be precharged prior to an access cycle, so the selected line will conditionally discharge depending upon whether the selected bit at the intersection of the addressed X and Y lines is programmed a 1 or a 0. No virtual ground decoding is needed because all source regions 12 are always connected to Vss by regions 16.

With reference to FIGS. 5, 6, and 7a–7d, an electrically programmable read only memory (EPROM) array is illustrated which is constructed according to another embodiment of the invention. As above, the array consists of a large number of cells 10, eight of which are shown. Each cell is a floating gate type transistor having a control gate 11, a source 12, a drain 13, and a floating gate 14. The floating gates 14 are parts of a first level polysilicon layer, and the control gates 11 are part of second level polysilicon strips 15 which are the X address lines. The sources 12 are part of N+ diffused regions 16 connected to ground, and the drains 13 are part of N+ diffused regions 17 connected to metal Y lines 18 via third level polysilicon segments 19 as above; these segments make connection to the silicon regions 17 at contact areas 20, and make connection to the metal strips 18 at contact areas 21.

Figure 5:
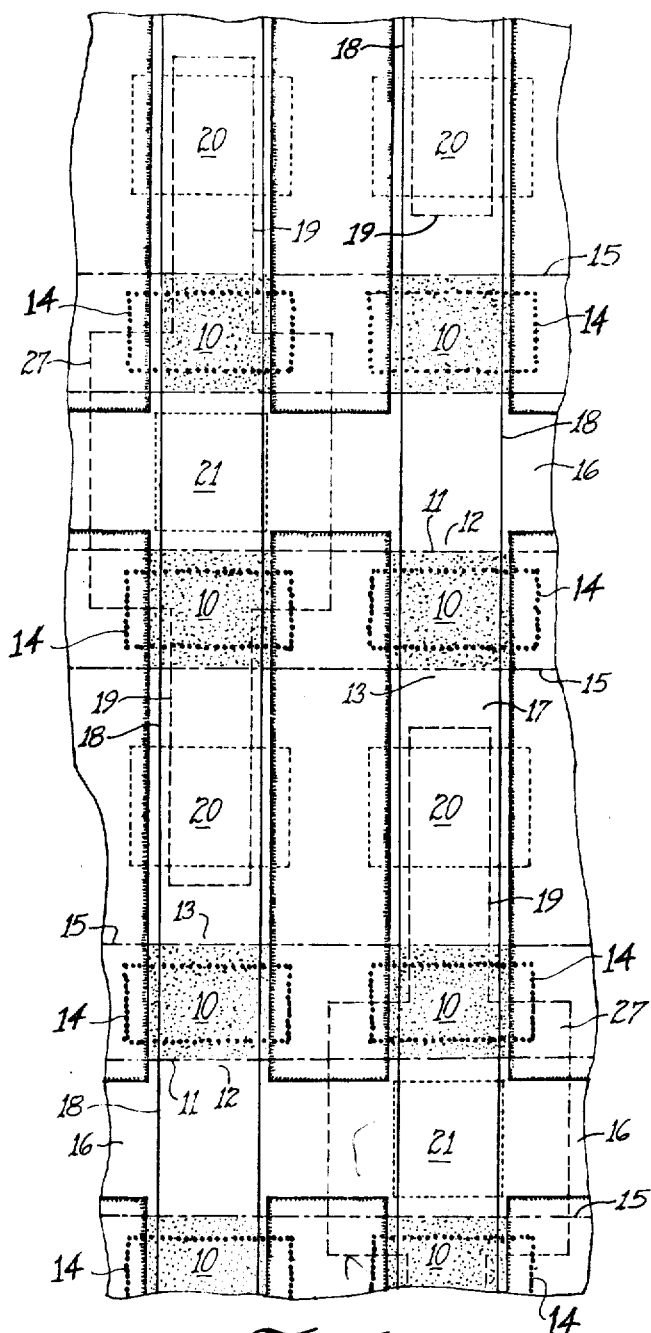
FIG. 5 is a greatly enlarged plan view of a small portion of a semiconductor chip showing the physical layout of a part of an EPROM array made according to another embodiment of the invention.
Figure 6:
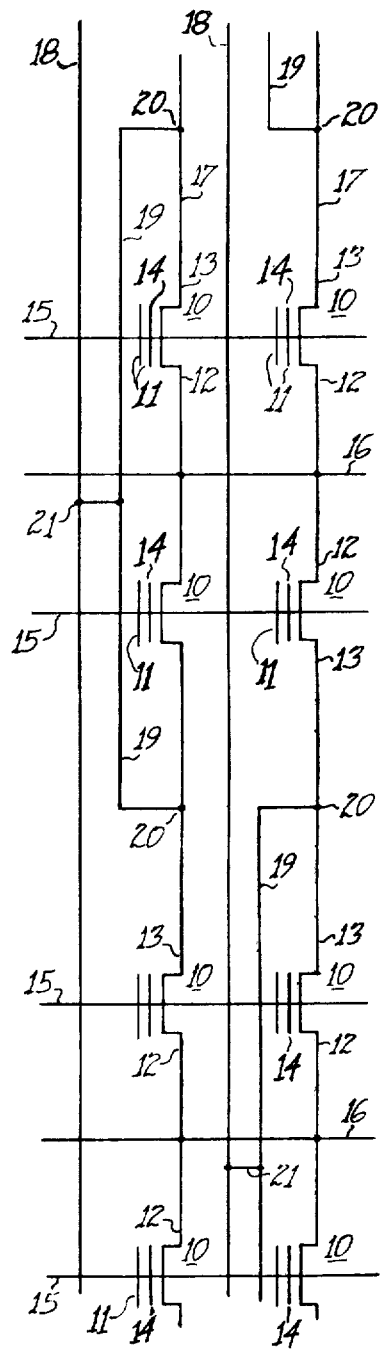
FIG. 6 is an electrical schematic diagram of the EPROM of FIG. 5.
Figure 7A:
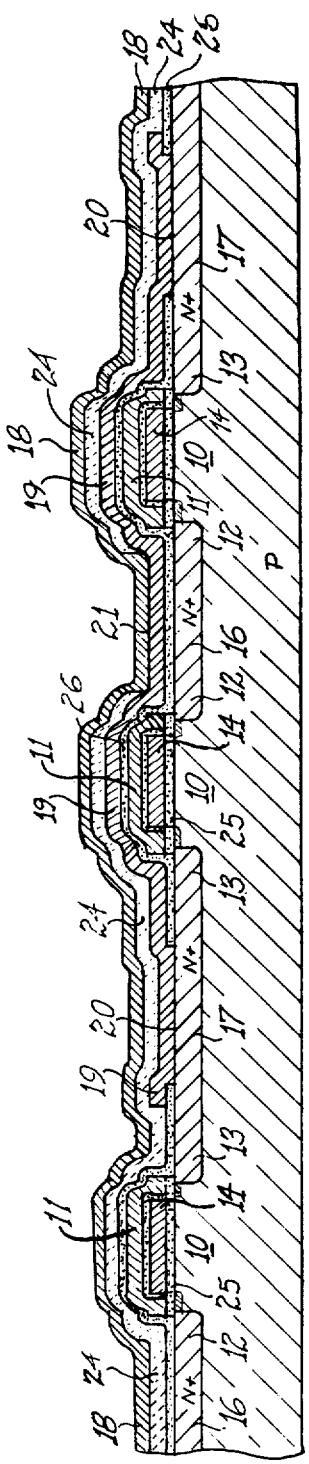
FIGS. 7a-7d are elevation views in section of the cell of FIG. 5, taken along the lines a—a, b—b, c—c, and d—d, respectively.
Figure 7D:
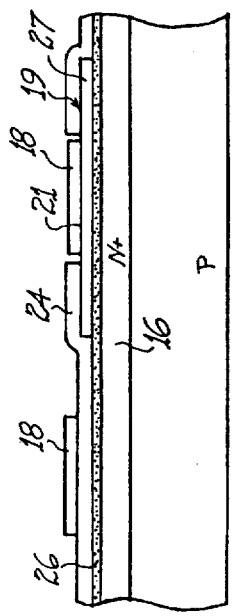
Figure 8:
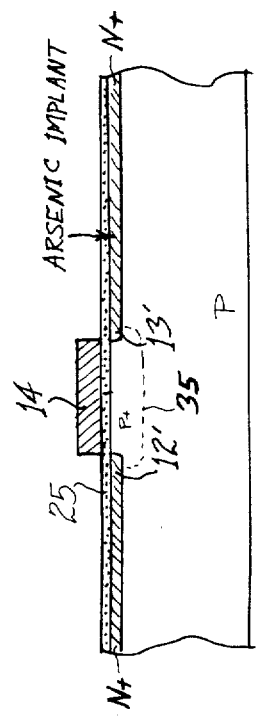
FIG. 8 is an elevation view in section of the EPROM array of FIGS. 5 and 7a-7d, at one stage in the manufacturing process, taken generally along the line a—a in FIG. 5.
Figure 7B:
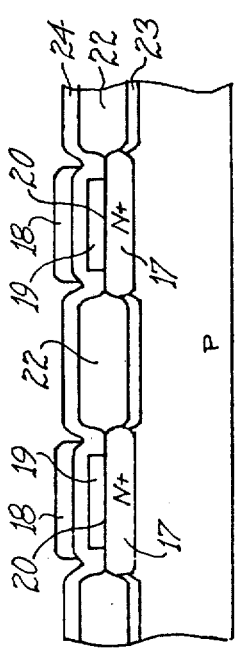
Figure 7C:
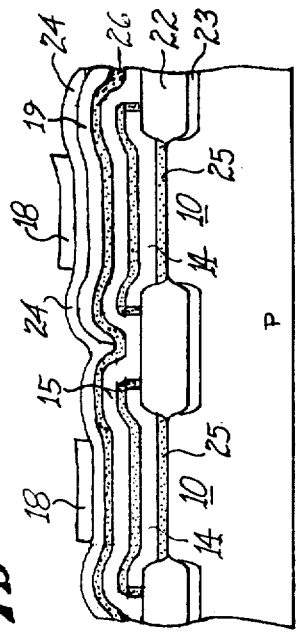

Except for the floating gate 14, the structure of the embodiment of FIGS. 5-7 is basically the same as that of FIGS. 1-3. The process for making the device is generally the same, except that a triple-level poly process is used instead of a double-level poly process. Of course, no implant programming is used because electrical programming is employed as set forth in U.S. Pat. Nos. 4,112,509 and 4,112,544, issued to Wall and McElroy, assigned to Texas Instruments, or U.S. Pat. No. 3,984,822. Erase is by ultraviolet light. A P+ tank region 35 is formed in the area of the channel as is the usual practice; this is done by a selective implant at an appropriate point in the process, such as prior to growing the field oxide 22. Also, shallow extensions 12' and 13' for the source and drain are created by an arsenic implant performed after the first-level poly floating gate 14 is defined, as illustrated in FIG. 8, but prior to deposition of the second level poly which creates the control gate 11.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making an array of memory cells in a face of a semiconductor body, each memory cell including an insulated gate field-effect transistor having a gate electrode and a source/drain path between source and drain regions; comprising the steps of:

applying a first layer of conductive material to said face and patterning such layer to define said gate electrode of each of a plurality of said cells, introducing conductivity-type determining impurity into said face adjacent said gate electrodes to define said source and drain regions of each of said cells, applying a second layer of conductive material to said face insulated from said first layer and patterning it to define a connector segment which contacts said source or drain regions at a first contact area for each adjacent set of said cells, each connector segment extending across at least one of said first electrodes, and applying a metal layer to said face insulated from the first and second layers except at second contact areas and patterning the metal layer to define a plurality of lines each of which extends across a plurality of adjacent sets of cells, the second contact areas being parts of said connector segment spaced from said first contact areas.

2. A method according to claim 1 wherein the semiconductor body is silicon, and the conductive material is polycrystalline silicon.

3. A method according to claim 2 wherein the first layer is patterned to define first elongated strips defining address lines before the second layer is applied.

4. A method according to claim 3 wherein the first layer defines the gates of a plurality of field effect transistors in rows.

5. A method according to claim 4 wherein a thick insulator separates said layer of metal from said face except at said second contact area.

6. A method according to claim 5 wherein a coating of thick thermal field oxide is formed on parts of said face before applying said first conductive layer.

7. A method according to claim 6 wherein an array of rows and columns of said cells is formed at said face, and the layer of metal includes parallel strips of metal, each strip contacting a plurality of cells in a column.

8. A method according to claim 7 wherein each connector segment includes wide areas at said second contact areas alternately spaced along adjacent columns of cells.

9. A method according to claim 4 wherein the memory cells are floating gate type electrically programmable read-only memory cells, and the gate electrodes are control gates for the cells.

10. A method according to claim 9 wherein floating gates are formed beneath each of said gate electrodes.

* * * * *